(12) United States Patent
Usukura et al.

(10) Patent No.: US 10,586,925 B2
(45) Date of Patent: Mar. 10, 2020

(54) RELEASE FILM, DISPLAY DEVICE MANUFACTURING METHOD, AND DEVICE

(71) Applicant: TIANMA JAPAN, LTD., Kawasaki, Kanagawa (JP)

(72) Inventors: Takumi Usukura, Kawasaki (JP); Mamoru Okamoto, Kawasaki (JP)

(73) Assignee: TIANMA MICROELECTRONICS CO., LTD., Chenzhen (CN)

(*) Notice: Subject to any disclaimer, the term of this patent is extended or adjusted under 35 U.S.C. 154(b) by 0 days.

(21) Appl. No.: 15/953,973

(22) Filed: Apr. 16, 2018

(65) Prior Publication Data

US 2018/0301628 A1    Oct. 18, 2018

(30) Foreign Application Priority Data

Apr. 17, 2017 (JP) ................ 2017-081287
Jan. 9, 2018 (JP) ................ 2018-001151

(51) Int. Cl.
*H01L 51/52*    (2006.01)
*H01L 51/00*    (2006.01)
*H01L 51/56*    (2006.01)
*H01L 27/32*    (2006.01)

(52) U.S. Cl.
CPC ........ *H01L 51/003* (2013.01); *H01L 51/5253* (2013.01); *H01L 51/56* (2013.01); *H01L 27/3244* (2013.01); *H01L 2227/323* (2013.01); *H01L 2227/326* (2013.01); *H01L 2251/5338* (2013.01); *H01L 2251/566* (2013.01)

(58) Field of Classification Search
CPC .............................. H01L 51/52; H01L 51/56
See application file for complete search history.

(56) References Cited

U.S. PATENT DOCUMENTS

2014/0272597 A1* 9/2014 Mikhaylik .......... H01M 4/0402
                                                                429/233
2016/0365522 A1   12/2016 Seo et al.
2018/0093450 A1*  4/2018 Nagata ................. B32B 7/06

FOREIGN PATENT DOCUMENTS

JP        2006-216891 A    8/2006

* cited by examiner

*Primary Examiner* — Douglas M Menz
(74) *Attorney, Agent, or Firm* — Sughrue Mion, PLLC

(57) ABSTRACT

Provided is a release film to be in contact with a surface of a base member and a surface of an object between the surface of the base member and the surface of the object. The release film includes a crystalline layer and a debond layer in contact with the crystalline layer. The debond layer has pores and includes an amorphous substance soluble in a solvent.

13 Claims, 9 Drawing Sheets

COMPARATIVE EXAMPLE

RELEASE FILM, DISPLAY DEVICE MANUFACTURING METHOD, AND DEVICE

BACKGROUND

This disclosure relates to a release film, a display device manufacturing method, and a device.

Flexible devices such as flexible display devices and flexible solar cells have been extensively researched and developed. Among the flexible display devices, organic light-emitting diode (OLED) display devices suitable to have flexible structures have been vigorously researched and developed.

Manufacturing a flexible OLED display device forms a polyimide layer as a resin substrate on a glass substrate, forms thin-film transistor circuits and OLED elements on the polyimide layer, and debonds the glass substrate from the polyimide layer (refer to JP 2006-216891 A, for example).

SUMMARY

An aspect of disclosure is a release film to be in contact with a surface of a base member and a surface of an object between the surface of the base member and the surface of the object, the release film including: a crystalline layer; and a debond layer in contact with the crystalline layer, wherein the debond layer has pores and includes an amorphous substance soluble in a solvent.

It is to be understood that both the foregoing general description and the following detailed description are exemplary and explanatory and are not restrictive of this disclosure.

EMBODIMENTS

Hereinafter, an embodiment of this invention will be described with reference to the accompanying drawings. It should be noted that the embodiment is merely an example to implement this invention and is not to limit the technical scope of this invention. Elements common to the drawings are denoted by the same reference signs.

In this disclosure, a release film and a debonding process by dissolving the release film are described. The debonding is also referred to as separating. The release film and the debonding process of this disclosure are applicable to flexible display devices such as flexible organic light-emitting diode (OLED) display devices. The release film and the debonding process of this disclosure are applicable to debond an object from a base member in other implementation. Described hereinafter is an example of a flexible OLED display device.

Configuration of Flexible Display Device

Figure 1:
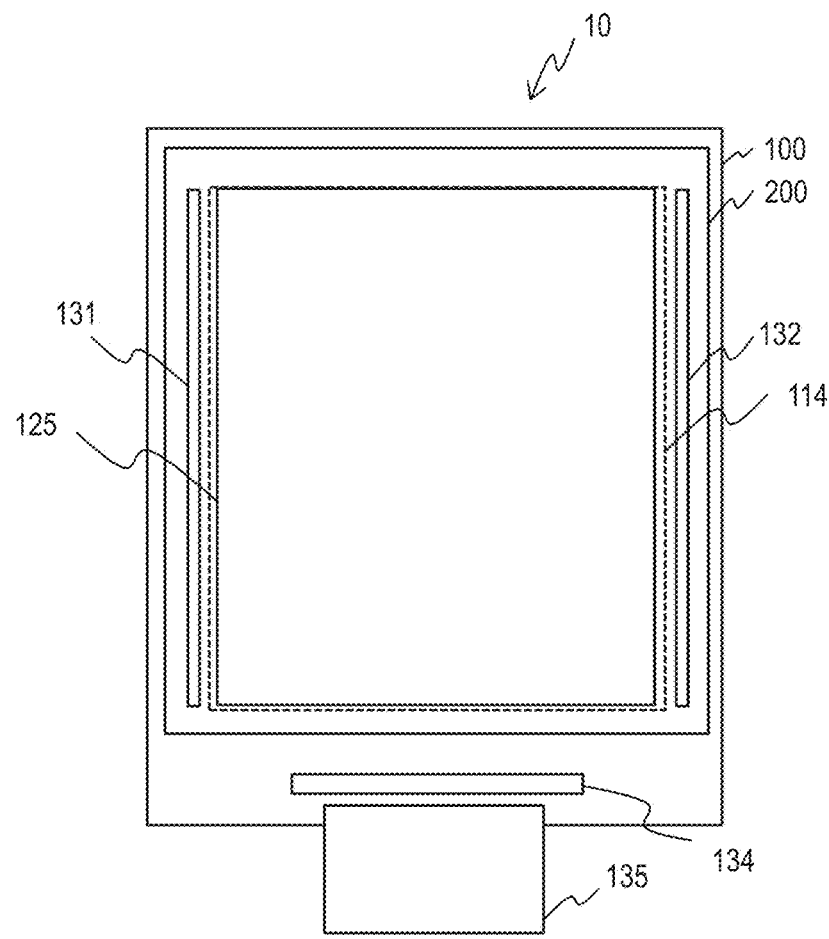
FIG. 1 schematically illustrates a configuration example of a flexible OLED display device.

A configuration of a flexible OLED display device (hereinafter, also referred to simply as display device) 10 is described. It should be noted that the elements in the drawings may be exaggerated in size or shape for clear understanding of the description. FIG. 1 schematically illustrates a configuration example of the display device 10. The display device 10 includes a thin film transistor (TFT) substrate 100 on which OLED elements and TFTs are formed and an encapsulation unit 200 for encapsulating the OLED elements.

In the periphery of a cathode electrode forming region 114 larger than the display region 125 of the TFT substrate 100, a scanning driver 131, an emission driver 132, and a driver IC 134 are provided. These are connected to the external devices via a flexible printed circuit (FPC) 135.

The scanning driver 131 drives scanning lines of the TFT substrate 100. The emission driver 132 drives emission control lines to control the emission periods of sub-pixels. The driver IC 134 can be mounted with an anisotropic conductive film (ACF).

The driver IC 134 provides power and timing signals (control signals) to the scanning driver 131 and the emission driver 132 and further, provides data voltage corresponding to image data to data lines. In other words, the driver IC 134 has a display control function. Hereinafter, the device composed of the TFT substrate 100 and the encapsulation unit 200 can be referred to as flexible display panel or display panel.

Figure 2:
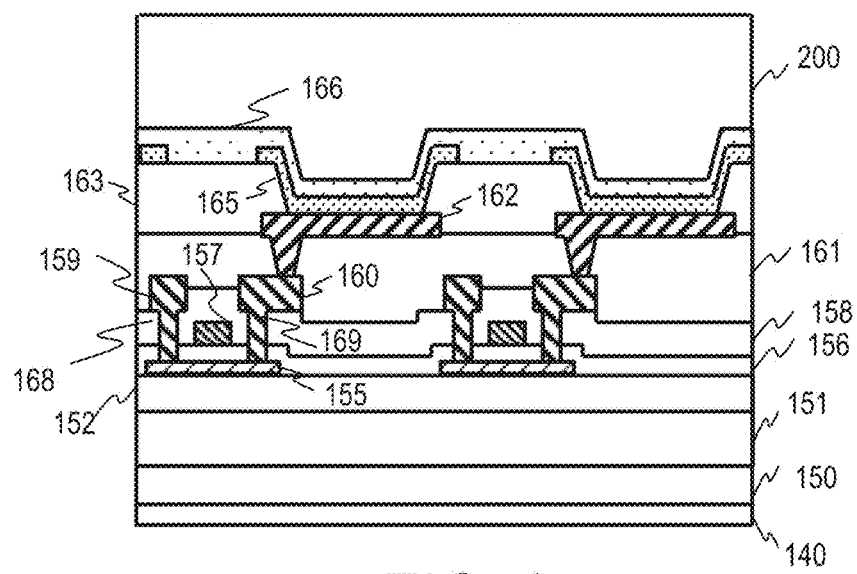
FIG. 2 schematically illustrates a part of a cross-sectional structure of a flexible OLED display device.

Next, a pixel structure of the display device 10 is described. FIG. 2 schematically illustrates a part of a cross-sectional structure of the display device 10. The display device 10 includes a TFT substrate 100 (see FIG. 1) and an encapsulation unit 200 opposed to the TFT substrate 100. FIG. 2 schematically illustrates a part of the configuration of the TFT substrate 100. The definitions of top and bottom in the following description correspond to the top and the bottom of the drawing.

As illustrated in FIG. 2, the display device 10 includes a flexible insulating substrate 151 and an encapsulation unit 200 opposed to the flexible insulating substrate 151. The encapsulation unit 200 has a thin film encapsulation (TFE) structure, for example, and is also referred to as barrier film 200.

The display device 10 includes anode electrodes 162, a cathode electrode 166, and a plurality of organic light-emitting layers 165 disposed between the flexible insulating substrate 151 and the encapsulation unit 200. The cathode electrode 166 is a transparent electrode that transmits the light from the organic light-emitting layers 165 toward the encapsulation unit 200.

An organic light-emitting layer 165 (also called an organic light emitting film 165) is disposed between the cathode electrode 166 and an anode electrode 162. A plurality of anode electrodes 162 are disposed on the same plane and above each anode electrode 162, an organic light-emitting layer 165 is disposed.

The display device 10 has a plurality of circuits each including a plurality of switches. Each circuit is provided between the flexible insulating substrate 151 and an anode electrode 162 and controls the electric current to be supplied to the anode electrode 162. Although FIG. 2 illustrates an example of a top-emission pixel structure, the flexible display device manufacturing method in this embodiment is applicable to a flexible display device having any pixel structure such as bottom-emission pixel structure. Alternatively, the flexible display device can be a transmissive flexible display device, namely, so-called transparent flexible display.

Hereinafter, the display device 10 is described in more detail. The TFT substrate 100 includes sub-pixels (pixels) arrayed within a display region and lines provided in a wiring region surrounding the display region. The lines connect the pixel circuits with the control circuits (131 and 132, for example) provided in the wiring region.

A sub-pixel displays one of the colors of red, green, and blue. A red sub-pixel, a green sub-pixel, and a blue sub-pixel constitute one pixel (main pixel). A sub-pixel is composed of an OLED element and a pixel circuit including a plurality of TFTs. The OLED element is composed of an anode electrode of a lower electrode, an organic light-emitting layer, and a cathode electrode of an upper electrode. A plurality of OLED elements are formed of one cathode electrode 166, a plurality of anode electrodes 162, and a plurality of organic light-emitting layers 165.

The flexible insulating substrate 151 is made of polyimide, for example. In the following description, the side closer to the flexible insulating substrate 151 is defined as lower side and the side farther from the insulating substrate 151 is defined as upper side. On the lower side of the flexible insulating substrate 151, a barrier film 150 is provided. The barrier film 150 is made of silicon oxide or silicon nitride, for example. On the lower side of the barrier film 150, a part of a release film 140 is attached, remaining without being dissolved in the debonding step in the manufacture. The release film will be described later in detail.

Above the flexible insulating substrate 151, semiconductor layers 155 are provided with an insulating film 152 interposed. The insulating film 152 is an inorganic insulating film and is also referred to as barrier film. The semiconductor layers 155 include low-temperature poly-silicon (LTPS), for example. The semiconductor layers 155 can be of low-temperature poly-silicon, amorphous silicon, or oxide semiconductor. The TFT can be a so-called organic TFT.

Above the semiconductor layers 155, gate electrodes 157 are provided with a gate insulating film 156 interposed. An interlayer insulating film 158 is provided over the gate electrodes 157. Within the display region 125, source electrodes 159 and drain electrodes 160 are provided above the interlayer insulating film 158. The source electrodes 159 and the drain electrodes 160 are made of a metal having a high melting point or an alloy of such a metal. Each source electrode 159 and each drain electrode 160 are connected with a semiconductor layer 155 through contacts 168 and 169 provided in a contact hole of the interlayer insulating film 158.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole in the planarization film 161. The pixel circuits (TFTs) are formed below the anode electrodes 162.

Above the anode electrodes 162, an insulative pixel defining layer (PDL) 163 is provided to separate OLED elements. An OLED element is composed of an anode electrode 162, an organic light-emitting layer 165, and the cathode electrode 166 (a part thereof) formed in this order.

Above each anode electrode 162, an organic light-emitting layer 165 is provided. The organic light-emitting layer 165 is in contact with the pixel defining layer 163 in an opening and the periphery of the pixel definition layer 163. A cathode electrode 166 is provided over the organic light-emitting layer 165. The cathode electrode 166 is a transparent electrode. The cathode electrode 166 transmits all or part of the visible light from the organic light-emitting layer 165.

The laminated film of the anode electrode 162, the organic light-emitting layer 165, and the cathode electrode 166 formed at an opening of the pixel defining layer 163 corresponds to an OLED element. The cathode electrode 166 is common to the anode electrodes 162 and the organic light-emitting layers 165 (OLED elements) that are formed separately. The barrier film 200 is made of a transparent insulative material and can be a silicon nitride film or a silicon oxide film.

Manufacturing Method

An example of a method of manufacturing the display device 10 is described. This example manufactures a motherboard including a glass substrate and a plurality of display panels and cuts out display panel laminates each including a flexible display panel and the glass substrate from the motherboard. A silicon wafer can substitute for the glass substrate.

Thereafter, the method debonds the flexible display panel from the glass substrate of each display panel laminate. This disclosure is characterized by the process of debonding the flexible display panel from the glass substrate.

Figure 3A:
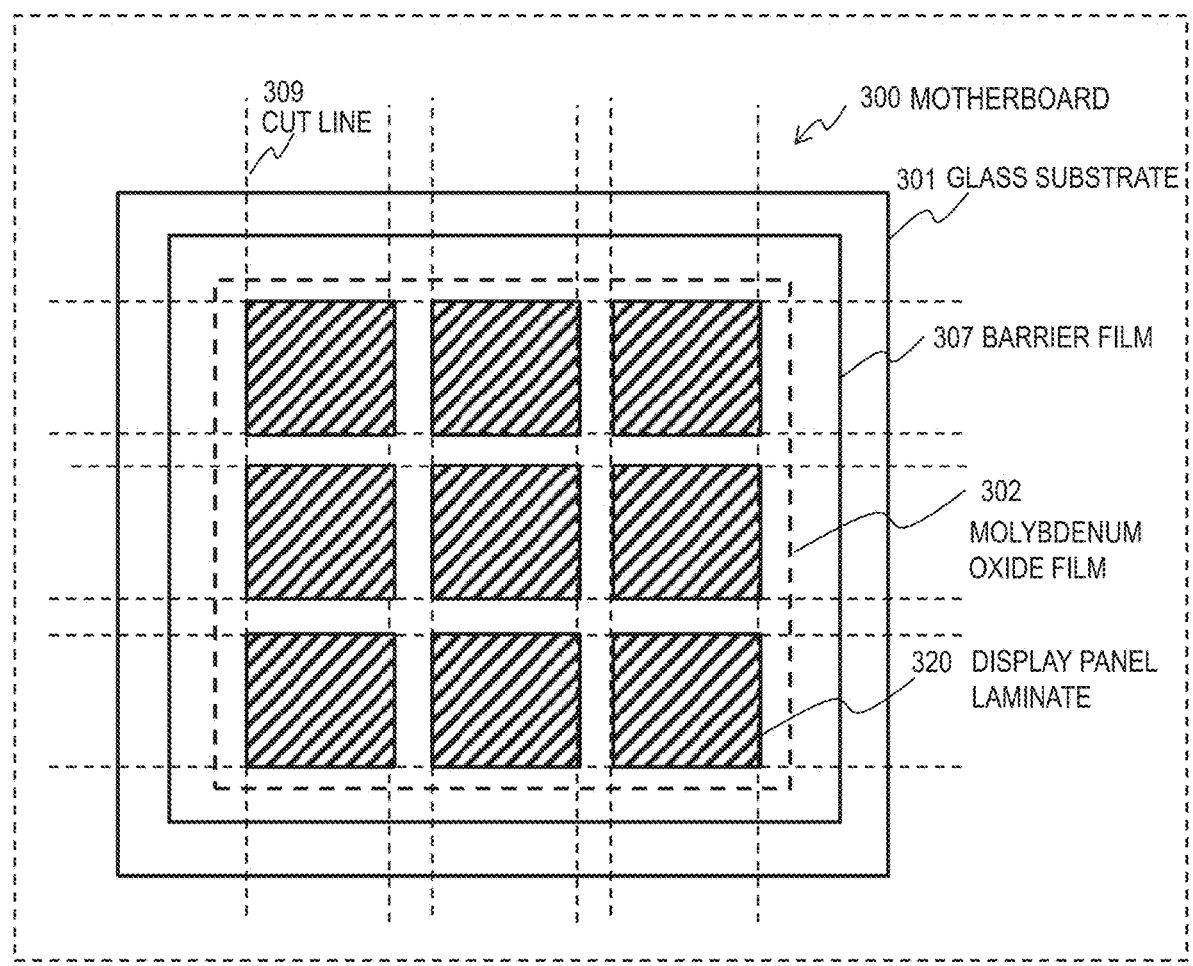
FIG. 3A is a plan diagram for schematically illustrating a configuration example of a motherboard.
Figure 3B:
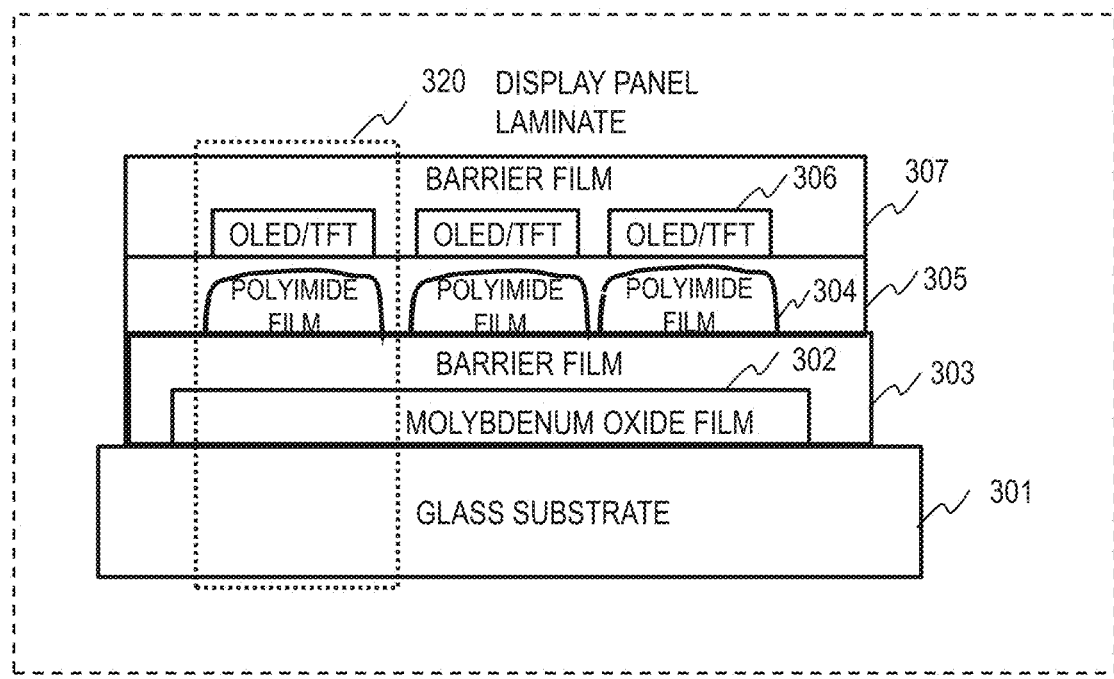
FIG. 3B is a cross-sectional diagram for schematically illustrating the configuration example of the motherboard.

FIG. 3A is a plan diagram for schematically illustrating a configuration example of a motherboard 300. FIG. 3B is a cross-sectional diagram for schematically illustrating a configuration example of the motherboard 300. As illustrated in FIG. 3A, the motherboard 300 includes a plurality of display panel laminates 320 before being cut out. The motherboard 300 is cut along cut lines 309 to take out a plurality of display panel laminates 320.

As illustrated in FIG. 3B, a release film 302 is provided on the glass substrate 301. This release film 302 contains molybdenum oxide ($Mo_xO_y$), and is also referred to as a molybdenum oxide film 302. The release film can contain various molybdenum oxides having different composition ratios together. The x and y for expressing the composition ratio are positive real numbers and the quotient (y/x) obtained by dividing y by x is a real number not less than two and not more than three. This quotient is preferably a value close to three. A part of the molybdenum oxide film 302 left in the debonding process corresponds to the part of the release film 140 of the display device 10 in FIG. 2.

A barrier film 303 is laminated (in other words, formed or coated) on the molybdenum oxide film 302. The barrier film 303 is an inorganic insulating film and can be a silicon oxide film, a silicon nitride film, a silicon oxynitride film, an aluminum oxide film, a tantalum oxide film, or a laminated film of two or more of these. The same applies to the other barrier films 305 and 307. The barrier film 303 corresponds to the barrier film 150 of the display device 10 in FIG. 2.

The barrier film 303 covers the entirety (the top surface and the end surface) of the molybdenum oxide film 302. The molybdenum oxide film 302 is enclosed tightly between the glass substrate 301 and the barrier film 303 and is not exposed. This configuration prevents the manufacturing steps of the TFT substrate 100 (such as cleaning process) from affecting the molybdenum oxide film 302.

A plurality of polyimide films 304 are laminated on the barrier film 303 separately in the same plane. Each polyimide film 304 corresponds to the flexible insulating substrate 151 of the display device 10 in FIG. 2. The flexible insulating substrate 151 can be a resin film different from the polyimide film 304. Such a resin film can be made of polyether sulfone (PES) or polyethylene terephthalate (PET), for example.

A barrier film 305 is laminated over the polyimide films 304. The barrier film 305 corresponds to the insulating film 152 of the display device 10 in FIG. 2. The barrier film 305 covers the entirety (the top surfaces and the end surfaces) of the polyimide films 304. The polyimide films 304 are enclosed tightly between the barrier film 303 and the barrier film 305 and are not exposed. Likewise, the polyimide film 304 of each cut-out display panel laminate 320 is enclosed tightly between the barrier film 303 and the barrier film 305 and is not exposed. Enclosing the polyimide film 304 tightly in the barrier film prevents the polyimide film 304 from absorbing moisture during the subsequent manufacturing steps and after separation from the glass substrate. Furthermore, this configuration prevents the OLED/TFT units 306 from getting wet with moisture (water) through the polyimide film 304.

As described above, the display panel has an elastic film (for example, the polyimide film 304) to hold the light-emitting elements (for example, the OLEDs in the OLED/TFT units 306) between the first barrier film 305 and the second barrier film 303 to block moisture penetration. This polyimide film 304 has a first surface in contact with the first barrier film 305 and the second surface on the opposite of the first surface and in contact with the second barrier film 303. The first surface has a so-called semicircular arching shape; the first surface has a larger area than the second surface.

A plurality of OLED/TFT units 306 are formed on the barrier film 305 to be separate from one another in the same plane and opposite to the plurality of polyimide films 304. In the drawing, one OLED/TFT unit 306 is stacked above one polyimide film 304 with the barrier film 305 interposed therebetween. The OLED/TFT unit 306 includes a circuit for the display panel including OLED elements and TFTs. The OLED/TFT unit 306 corresponds to the laminate from the semiconductor layers 155 to the cathode electrode 166 in FIG. 2.

A barrier film 307 is laminated over the OLED/TFT units 306. The barrier film 307 corresponds to the encapsulation unit 200 of the display device 10 in FIG. 2. The barrier film 307 covers the entirety (the top surfaces and the end surfaces) of the OLED/TFT units 306. The OLED/TFT units 306 are enclosed tightly between the barrier film 305 and the barrier film 307 and are not exposed. Likewise, the OLED/TFT unit 306 of each cut-out display panel laminate 320 is also enclosed tightly between the barrier film 305 and the barrier film 307 and is not exposed.

Figure 3C:
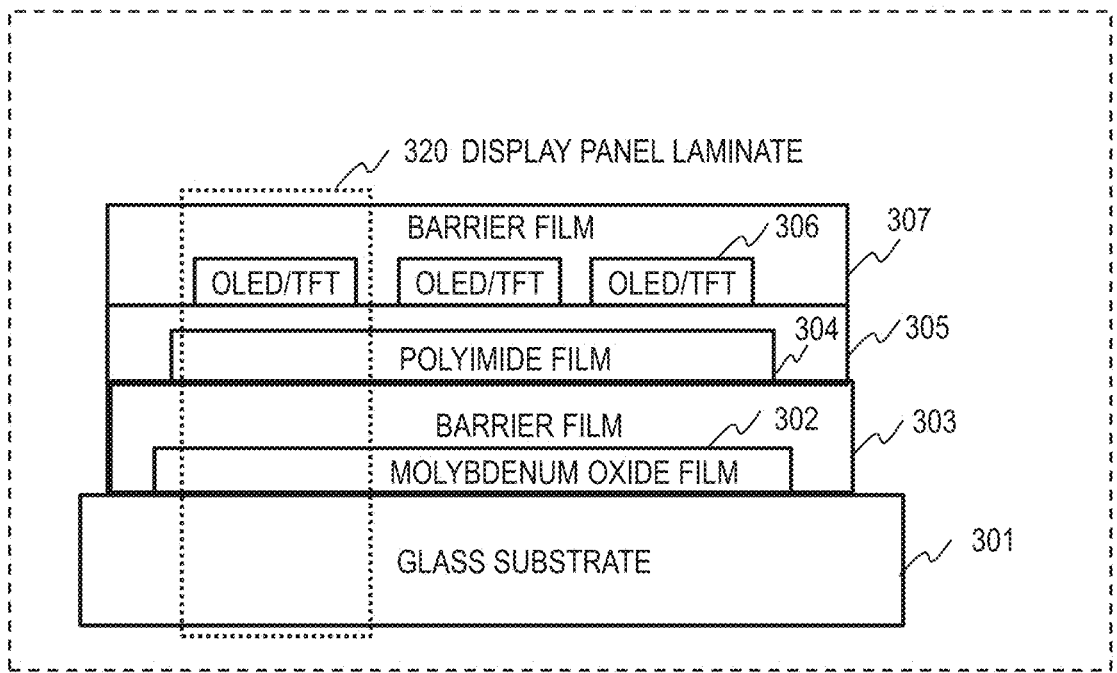
FIG. 3C is a cross-sectional diagram for schematically illustrating another configuration example of the motherboard.
Figure 3D:
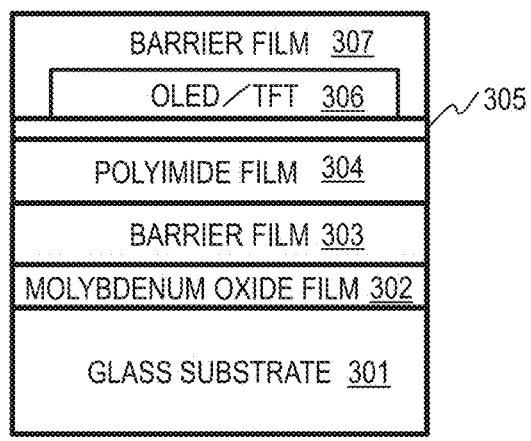
FIG. 3D is a cross-sectional diagram for schematically illustrating the other configuration example of a display panel laminate.

FIG. 3C is a cross-sectional diagram of another configuration example of the motherboard 300. The difference from FIG. 3B is that a single polyimide film 304 is provided. The polyimide film 304 is separated in cutting out the display panel laminates 320. FIG. 3D illustrates a cut-out display panel laminate 320. In the display panel laminate 320, the end surfaces of the polyimide film 304 are exposed. It is preferable that the exposed end surfaces do not contact water in debonding, which will be described later.

Figure 4A:
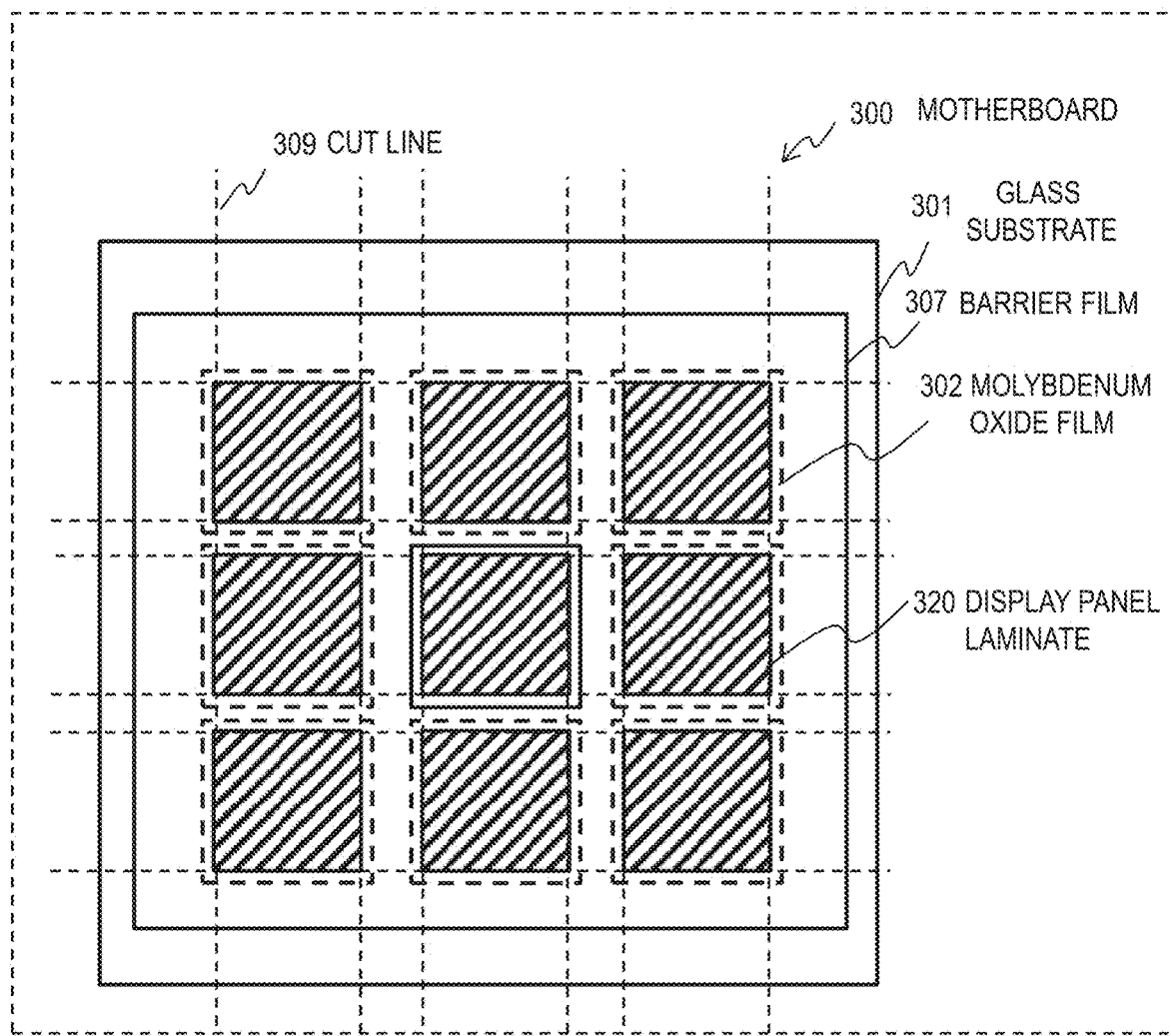
FIG. 4A is a plan diagram for schematically illustrating still another configuration example of the motherboard.
Figure 4B:
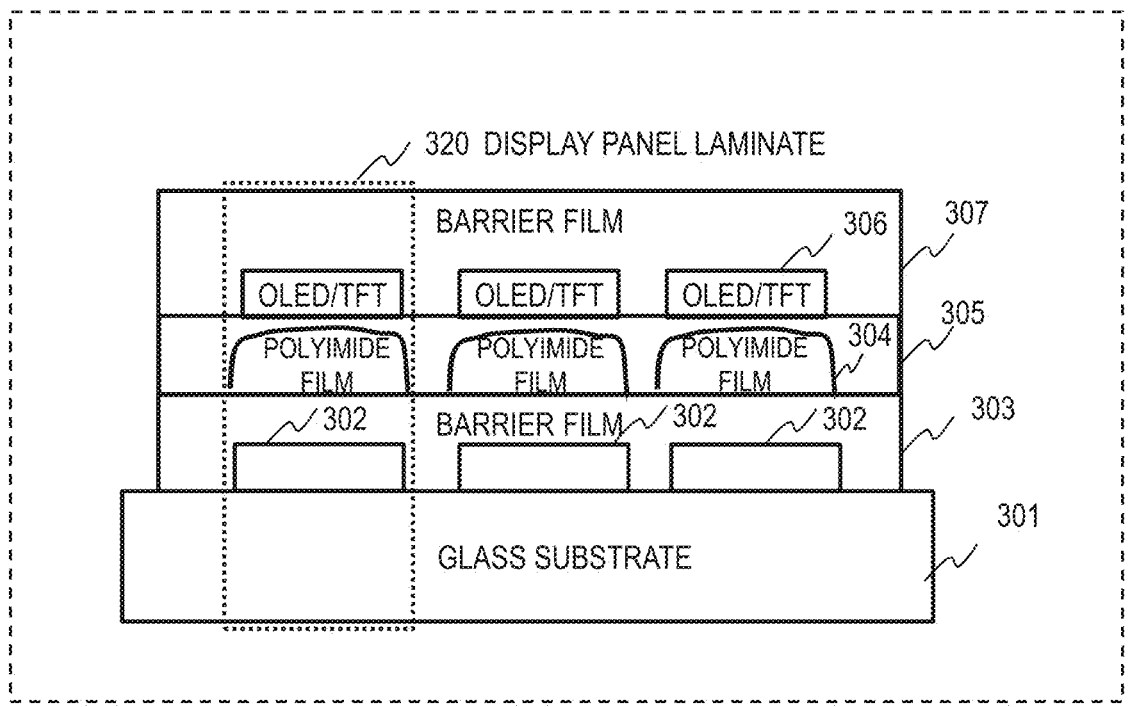
FIG. 4B is a cross-sectional diagram for schematically illustrating the still other configuration example of the motherboard.

FIG. 4A is a plan diagram for schematically illustrating still another configuration example of the motherboard 300. FIG. 4B is a cross-sectional diagram for schematically illustrating the still other configuration example of the motherboard 300. The difference from the configuration illustrated in FIGS. 3A and 3B is that a plurality of molybdenum oxide films 302 are formed separately in a plane. Each display panel laminate 320 includes one of the molybdenum oxide films 302.

The configuration example illustrated in FIGS. 3A and 3B is configured so that a plurality of polyimide films 304 and OLED/TFT units 306 are on a single molybdenum oxide film 302. In contrast, the example of FIGS. 4A and 4B is configured so that a plurality of molybdenum oxide films 302 are separate in a plane and a polyimide film 304 and an OLED/TFT unit 306 are stacked on each molybdenum oxide film 302. Since the barrier film 303 is in contact with the glass substrate 301 between molybdenum oxide films 302, high adhesion of the barrier film 303 (and the layers upper than the barrier film 303) to the glass substrate 301 is achieved.

Like the configuration described with reference to FIGS. 3C and 3D, a single polyimide film 304 may be provided for the plurality of molybdenum oxide films 302 to be separated in cutting out display panel laminates 320.

Figure 5:
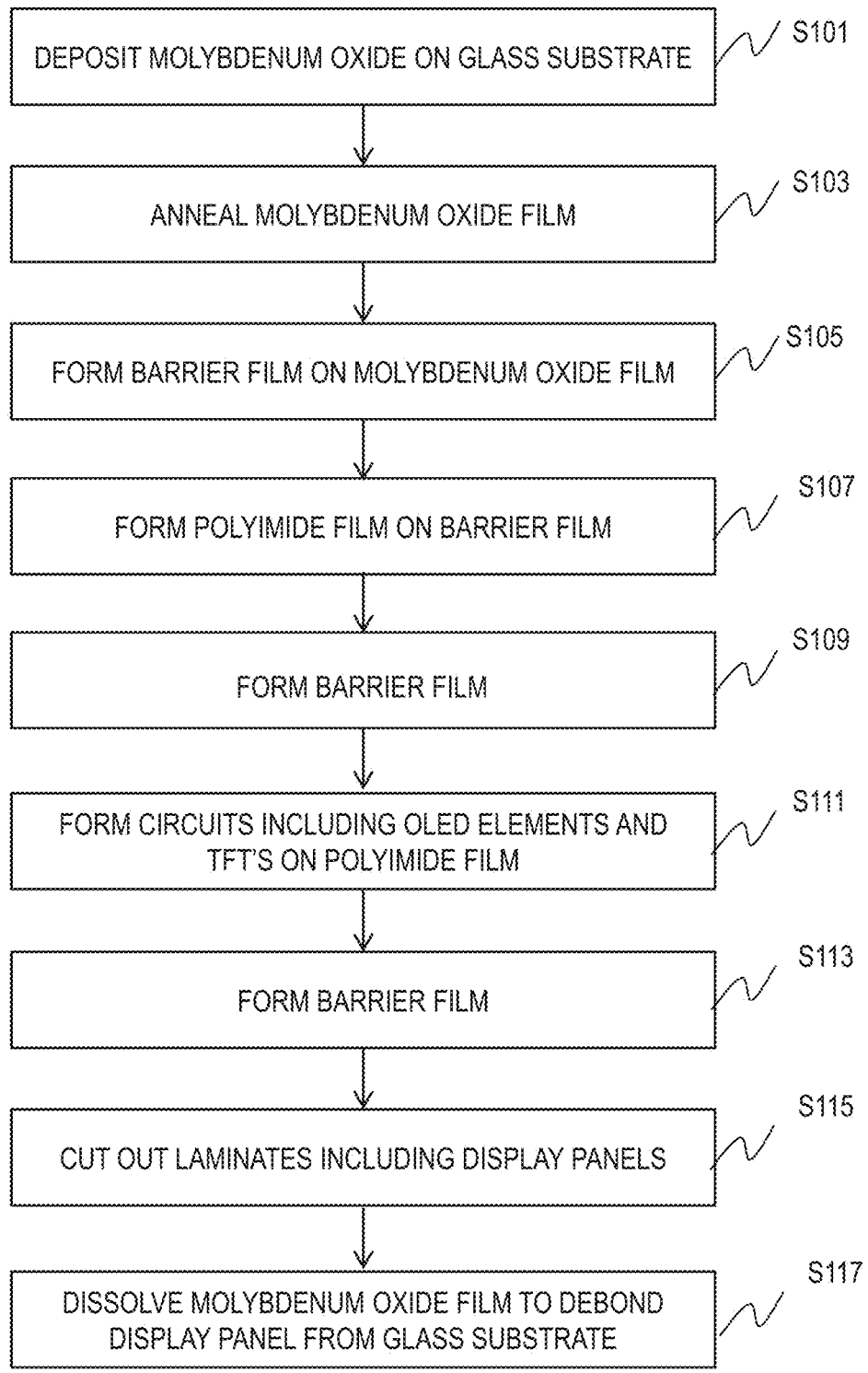
FIG. 5 is a flowchart of an example of a method of manufacturing a display panel.

FIG. 5 is a flowchart of an example of a method of manufacturing a display panel. Manufacturing a display panel includes the following steps. The following steps are performed by a manufacturing apparatus (not shown). Described hereinafter is an example using a molybdenum oxide film as a release film. At the first Step S101, the method forms a molybdenum oxide film on the glass substrate 301.

The molybdenum oxide film can be deposited by a known process such as sputtering, plasma vapor chemical reaction, or vacuum vapor deposition. As an example, the method forms the molybdenum oxide film on the glass substrate 301 by reactive sputtering at Step S101. Specifically, the method forms the molybdenum oxide film by performing reactive sputtering using molybdenum as a target in the gas conditions that argon gas and oxygen gas are mixed at a specific flow ratio (for example 1:0.85). The target can be molybdenum oxide. The molybdenum oxide is patterned by mask sputtering or etching.

At the next step S103, the method anneals the deposited molybdenum oxide film at a predetermined temperature for a predetermined time. The annealing is performed in the atmosphere, for example. The molybdenum oxide film before being annealed is amorphous. The annealing crystalizes a part of the metal oxide (such as the molybdenum oxide film) and simultaneously, forms a layer having pores and including an amorphous substance. To crystalize the molybdenum oxide, the annealing temperature needs to be 250° C. or higher; for example, the method anneals the film at 400° C. for one hour. The molybdenum oxide film after the annealing is the molybdenum oxide film 302 shown in FIGS.

3A to 4B. The details of the structure of the annealed molybdenum oxide film 302 will be described later.

At the next Step S105, the method forms the barrier film 303 on the molybdenum oxide film 302. As described with reference to FIGS. 3B and 4B, the entire area of the barrier film 303 is larger than the entire area of the molybdenum oxide film 302; the barrier film 303 is formed to cover the entire exposed area of the molybdenum oxide film 302.

The barrier film 303 is formed by plasma chemical vapor deposition (CVD), for example. The barrier film 303 can be formed by a different forming method, such as sputtering, vapor deposition, or coating. Since the molybdenum oxide film has high heat resistance, a barrier film 303 having high barrier properties can be formed by a high-temperature process from the beginning.

At the next Step S107, the method forms the polyimide films 304 on the barrier film 303. The polyimide films 304 can be formed by applying a solution containing the material and calcining or laminating a pre-formed polyimide film onto the barrier film 303. Specifically, forming the polyimide films 304 prints polyimide varnish on the desired areas and performs annealing (or curing) at a predetermined temperature. Alternatively, the forming the polyimide films 304 may laminate polyimide films onto only the necessary areas.

Next, the method forms the barrier film 305 to cover the polyimide films 304 at Step S109 and forms the OLED/TFT units 306 on the barrier film 305 at Step S111. The top surfaces and the end surfaces of the polyimide films 304 are covered with the barrier film 305 to completely enclose the polyimide films 304 in the barrier film 305. As a result, impurities caused by the polyimide film 304 are prevented from entering the OLED/TFT units 306 in the subsequent forming of the OLED/TFT units 306.

Forming the barrier film 305 (the insulating film 152) forms a silicon nitride film by plasma CVD, for example. Forming the OLED/TFT units 306 first forms a layer including the semiconductor layers 155 by a known low-temperature poly-silicon TFT fabrication technique.

Next, the method deposits silicon oxide, for example, over the semiconductor layers 155 by plasma CVD to form a gate insulating film 156. Furthermore, the method deposits a metal by sputtering and patterns the metal to form a metal layer including gate electrodes 157.

Next, the method dopes additional impurities to the semiconductor layers 155 doped with high-concentration impurities before formation of the gate electrodes 157 using the gate electrodes 157 as a mask to form a lightly doped drain (LDD) structure. Next, the method deposits silicon oxide by plasma CVD to form an interlayer insulating film 158.

The method opens contact holes in the interlayer insulating film 158 and the gate insulating film 156 by anisotropic etching. Next, the method deposits an alloy by sputtering and patterns the alloy to form a metal layer. The metal layer includes source electrodes 159, drain electrodes 160, and contacts 168 and 169.

Next, the method deposits a photosensitive organic material to form the planarization film 161 and subsequently, opens contact holes for connecting to the source electrodes 159 and drain electrodes 160 of the TFTs. The method forms anode electrodes 162 on the planarization film 161 having contact holes. The anode electrodes 162 are connected to the drain electrodes 160 through contacts.

Next, the method deposits a photosensitive organic resin by spin coating and patterns the photosensitive organic resin to form a pixel defining layer 163. The patterning creates holes in the pixel defining layer 163; the anode electrodes 162 of the sub-pixels are exposed at the bottom of the created holes. The pixel defining layer 163 forms separate light emitting regions of sub-pixels.

Next, the method applies organic light-emitting materials onto the flexible insulating substrate 151 provided with the pixel defining layer 163 to form organic light-emitting layers 165. An organic light-emitting layer 165 is formed by depositing an organic light-emitting material for the color of R, G, or B on each anode electrode 162. The organic light-emitting layers 165 are composed of one or more layers.

Next, the method applies a metal material for the cathode electrode 166 onto the TFT substrate 100 where the pixel defining layer 163 and the organic light-emitting layers 165 are exposed. The metal material adheres to the pixel defining layer 163 and the organic light-emitting layers 165. Through the foregoing processes, the OLED/TFT units 306 are formed.

Returning to FIG. 5, the method forms the barrier film 307 at Step S113. The barrier film 307 is deposited to cover all the exposed surfaces of the OLED/TFT units 306 inclusive of the top surfaces and the end surfaces. The barrier film 307 corresponds to the encapsulation unit 200 in FIG. 2. The barrier film 307 is a silicon nitride film formed by plasma CVD, for example. It should be noted that the above-described method of manufacturing organic light-emitting elements is an example; a different method utilizing ink-jet coating is also applicable.

At the next Step S115, the method cuts out laminates (display panel laminates) 320 including display panels from the motherboard 300. At Step S115, the method cuts out the display panel laminates 320 from the motherboard 300 by scribing or breaking along the cut lines.

At the final Step S117, the method dissolves the molybdenum oxide film 302 in each display panel laminate 320 to debond the display panel from the glass substrate 301. The glass substrate 301 is a base member and the display panel is an object to be debonded from the base member. Debonding by dissolving the molybdenum oxide film 302 does not depend on the characteristics of the flexible substrate (polyimide film 304), unlike laser debonding.

Release Film and Debonding Process

Figure 6:
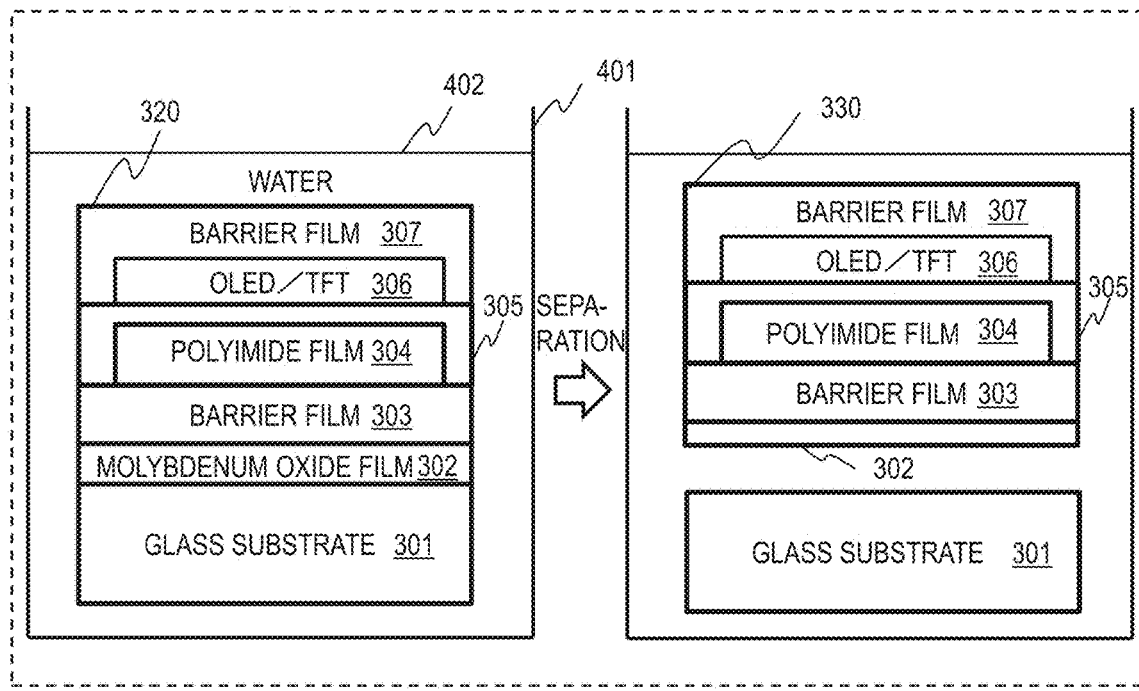
FIG. 6 schematically illustrates an example of the debonding process.

FIG. 6 schematically illustrates an example of the debonding process. The debonding process immerses a display panel laminate 320 into pure water 402 contained in a container 401. The pure water is a solvent for the molybdenum oxide film 302. The solvent can be various liquids (for example, water). The water can be water including electrolyte, pure water, or ultrapure water. In the following description, pure water is used as the solvent by way of example. The molybdenum oxide film 302 dissolves in the pure water 402 so that the display panel 330 is debonded from the glass substrate 301. The molybdenum oxide film 302 partially remains on the undersurface of the display panel 330. This will be described later.

In the case where the display panel laminate 320 has a rectangular shape, the four end surfaces (sides) of the molybdenum oxide film 302 are exposed. The molybdenum oxide film 302 starts dissolving from the exposed end surfaces and the dissolving progresses in the in-plane directions of the molybdenum oxide film 302. The polyimide film 304 and the OLED/TFT unit 306 are enclosed tightly in the barrier films and are not exposed, so that they are not affected by the pure water 402.

The display panel laminate 320 is immersed in the pure water 402 at a predetermined temperature for a predetermined time. For example, the pure water (warm water) 402 can be at the room temperature (25° C.) or a temperature higher than the room temperature, for example, 80° C. maintained by a heater. The debonding speed tends to increase as the temperature rises.

The debonding process may proactively produce a flow of the pure water 402 within the container 401. For example, the debonding process makes the flow of the pure water 402 hit all or a part of the four end surfaces of the molybdenum oxide film 302. This configuration raises the dissolving rate (debonding rate). The debonding process can form the flow by injecting pure water into the container 401 from an inlet provided on the container 401 and ejecting the pure water from an outlet.

Figure 7:
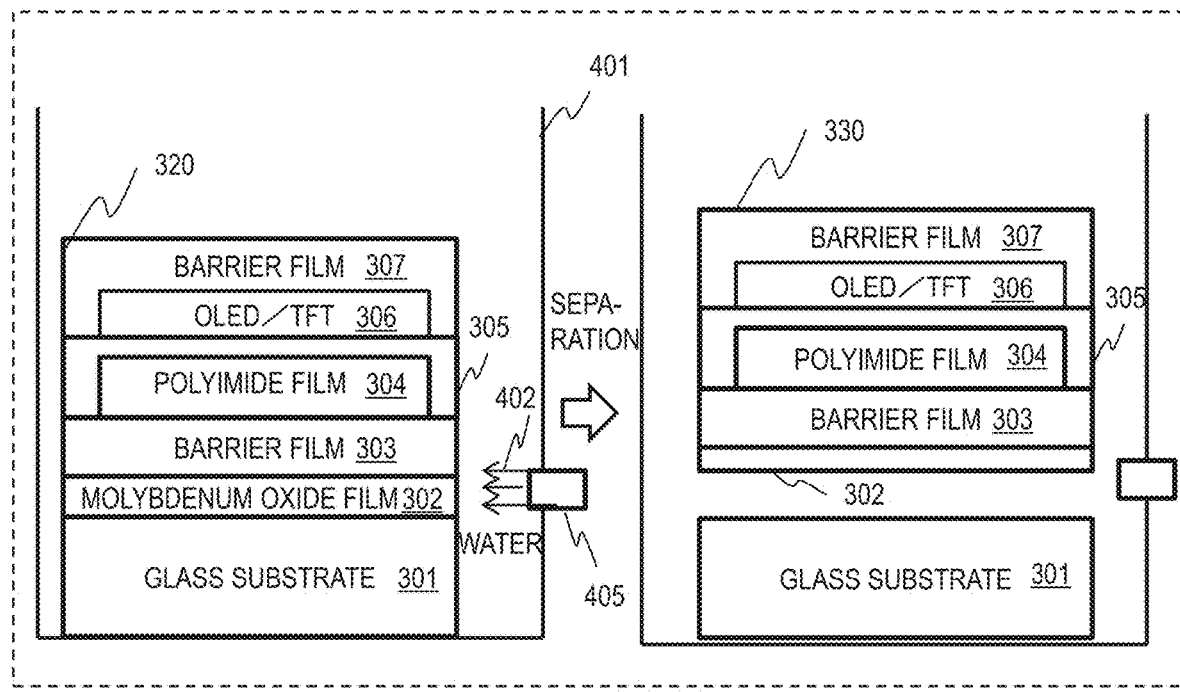
FIG. 7 schematically illustrates another example of the debonding process.

FIG. 7 schematically illustrates another example of the debonding process. The debonding process hits an end surface of the molybdenum oxide film 302 of the display panel laminate 320 with pure water 402 ejected from a nozzle 405 in a gas. That is to say, the end surface is placed in the atmosphere. Compare to the method of FIG. 6 that immerses the display panel laminate 320 in impounded water without a flow, this method increases the dissolving rate. The debonding process hits a part or all of the end surfaces of the molybdenum oxide film 302 with pure water. The process may hit the molybdenum oxide film 302 with not only the liquid but also gaseous pure water ejected from the nozzle 405.

The molybdenum oxide film 302 in this embodiment shows high dissolving rate in an in-plane direction, compared to the existing release films. This high dissolving rate significantly improves the manufacturing throughput and significantly reduces the effects of the debonding process onto the display panel 330. The inventor's research revealed that one of the reasons for the high dissolving rate of the molybdenum oxide film 302 is the characteristic structure thereof and the characteristic dissolution phenomenon caused by the structure.

The molybdenum oxide film 302 has the highest dissolving rate at its lowermost layer including the interface with the glass substrate 301. Water enters the interface between the molybdenum oxide film 302 and the glass substrate 301 to debond the display panel 330. For this reason, as illustrated in FIGS. 6 and 7, the upper layer of the molybdenum oxide film 302 partially remains on the undersurface of the barrier film 303 after separation.

Figure 8:
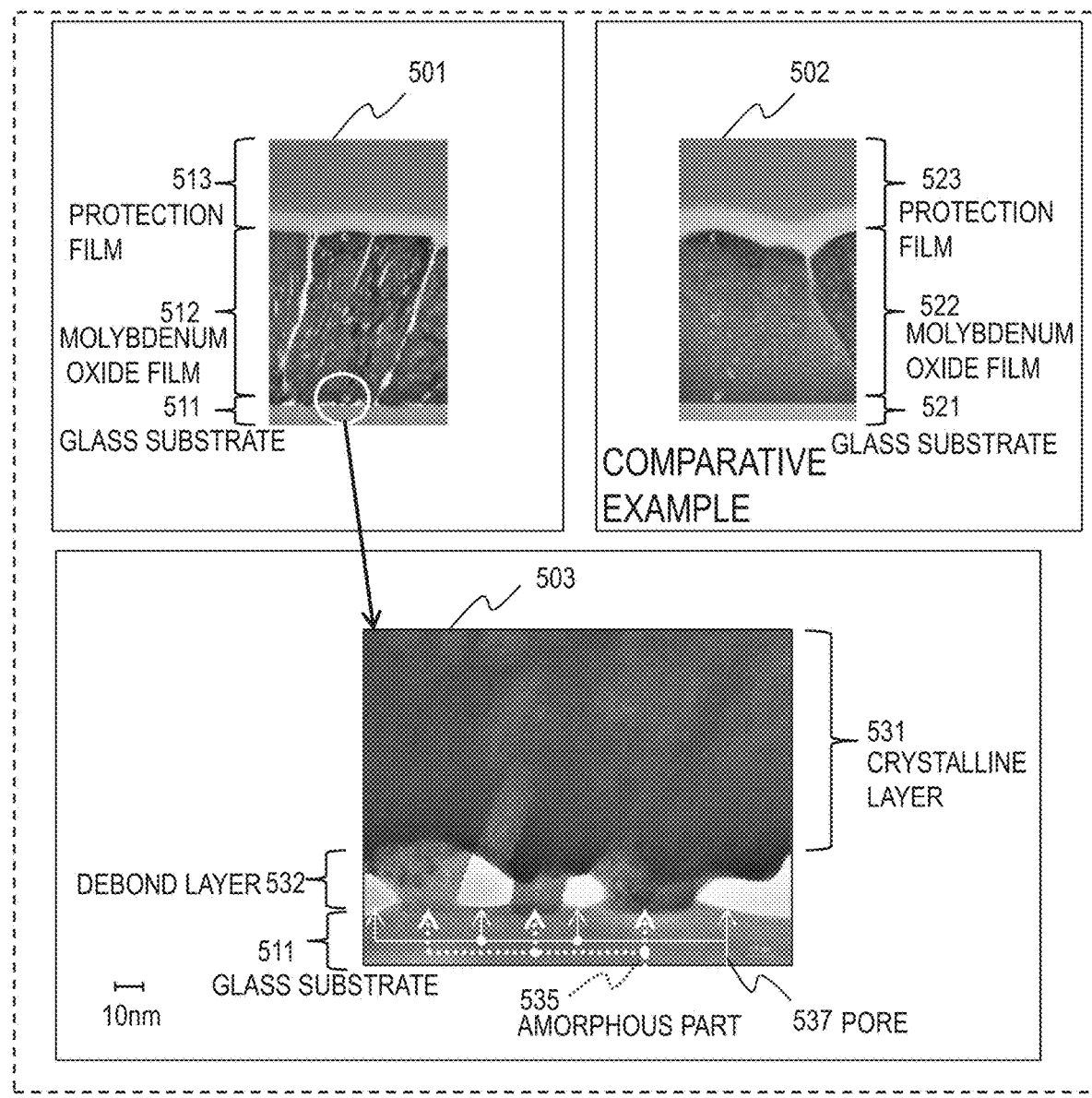
FIG. 8 is a TEM image of a cross-section of an annealed molybdenum oxide film in the embodiment and a TEM image of a cross-section of a molybdenum oxide film as a comparative example.

FIG. 8 includes a TEM image 501 of a cross-section of the annealed molybdenum oxide film in this embodiment and a TEM image 502 of a cross-section of a molybdenum oxide film as a comparative example. The term "TEM" is an acronym of "transmission electron microscope". FIG. 8 also includes a partially enlarged TEM image 503 of the molybdenum oxide film of this embodiment. Between this embodiment and the comparative example, conditions in forming the films are different. Specifically, the molybdenum oxide film of this embodiment was formed by reactive sputtering using molybdenum as the target in the gas conditions that argon gas and oxygen gas are mixed at a flow ratio of 1:0.85. The molybdenum oxide film of the comparative example was formed by reactive sputtering using molybdenum as the target in the gas conditions that argon gas and oxygen gas are mixed at a flow ratio of 1:1. The conditions for annealing were at 400° C. for one hour in both cases of this embodiment and the comparative example.

The TEM image 501 of the molybdenum oxide film of this embodiment shows a glass substrate 511, a molybdenum oxide film 512 on the glass substrate, and a protection film 513 on the molybdenum oxide film 512. The glass substrate 511 and the molybdenum oxide film 512 are examples of the glass substrate 301 and the molybdenum oxide film 302, respectively, in FIGS. 3 to 7. The TEM image 502 of the molybdenum oxide film of the comparative example shows a glass substrate 521, a molybdenum oxide film 522 on the glass substrate, and a protection film 523 on the molybdenum oxide film 522. The protection films 513 and 523 are films formed in processing the samples for TEM observation.

The release film of this embodiment is provided between a surface of a base member (for example, the glass substrate 511) and a surface of an object (for example, a display panel including the protection film 513) and is in contact with the surface of the base member and the surface of the object. This release film is in contact with the entire interface with the surface of the base member. The material of this release film is a metal oxide; this embodiment employs the molybdenum oxide film 512. The molybdenum oxide film 512 has a crystalline layer 531 and a debond layer 532 in contact with the crystalline layer 531. The debond layer 532 has pores 537 and includes amorphous parts 535 to be dissolved in the solvent. The crystalline layer 531 is formed between the debond layer 532 and the surface of the protection film 513.

As noted from the TEM image 501, the molybdenum oxide film 512 of this embodiment has a large number of pores (white spots) scattered in its entirety and further, large spaces (vertically extending white parts) between crystal grain boundaries. In contrast, the molybdenum oxide film 522 of the comparative example has a small number of large pores but does not have a large number of pores like this embodiment.

As noted from the partially enlarged TEM image 503 of the molybdenum oxide film 512 of this embodiment, a large number of pores 537 are formed in the area including the interface between the molybdenum oxide film 512 and the glass substrate 511; the porosity there is higher than the other area. The debond layer 532 having high porosity is spread over the entire interface between the molybdenum oxide film 512 and the glass substrate 511.

The area including the interface between the molybdenum oxide film 512 and the glass substrate 511 corresponds to the debond layer 532. That is to say, the debond layer 532 is formed on the surface of the glass substrate 511. The layer above the debond layer 532 is the crystalline layer 531. The entirety of the debond layer 532 is porous and the porosity thereof is higher than the porosity of the crystalline layer 531. The thickness of the debond layer 532 varies between 15 nm and 25 nm. The thickness of the entire molybdenum oxide film 512 is approximately 1 μm and the debond layer 532 is not more than 5% (but more than 0%) of the molybdenum oxide film 512.

As noted from the TEM image 503, pores 537 and amorphous parts 535 exist alternately in the debond layer 532 including the interface between the molybdenum oxide film 512 and the glass substrate 511 in an in-plane direction. The sizes of the pores and the amorphous parts are several tens nanometers (10 nm order).

Figure 9A:
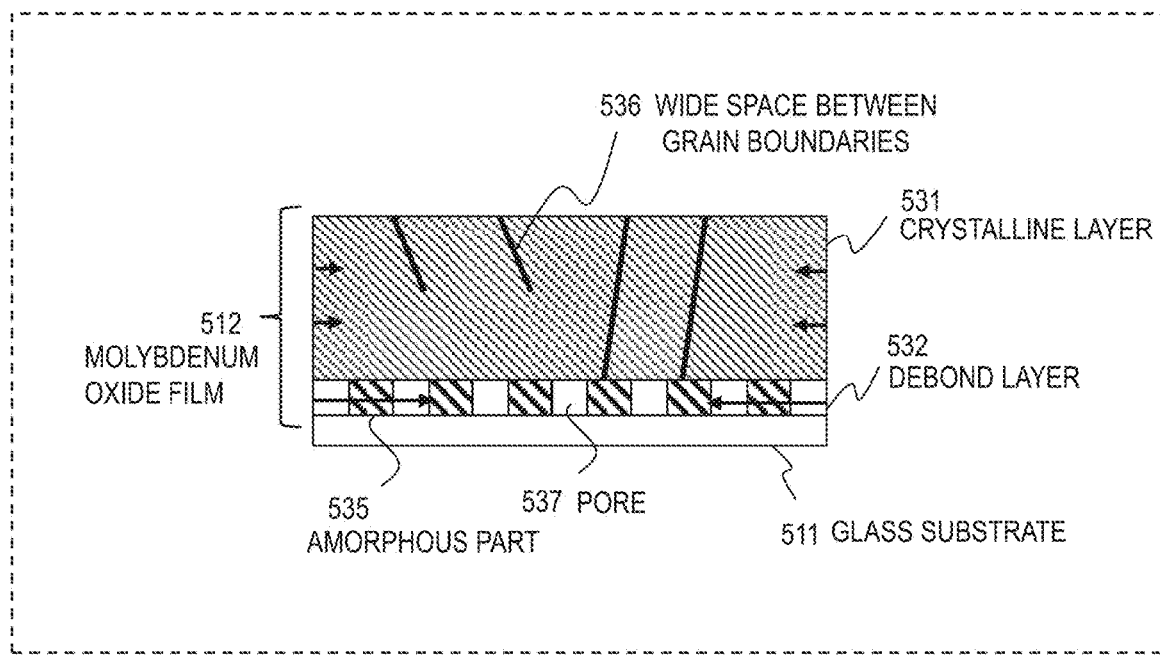
FIG. 9A schematically illustrates the cross-sectional structure of the molybdenum oxide film of the embodiment.

FIG. 9A schematically illustrates the cross-sectional structure of the molybdenum oxide film 512 of this embodiment. The arrows represent the directions in which the solvent penetrates or the dissolution advances in parallel to the plane of the glass substrate 511 (in in-plane directions). The sizes of the arrows schematically represent the magnitudes of the dissolving rate (also referred to as dissolving speed).

The molybdenum oxide film 512 of this embodiment has a two-layer structure. The molybdenum oxide film 512 has a crystalline layer 531 as an upper layer (on the side of the barrier film) and a debond layer 532 as a lower layer (on the side of the glass substrate). The molybdenum oxide film 512 immediately after being deposited is amorphous and crystalizes by annealing treatment to become the crystalline layer 531. The debond layer 532 is a layer that does not crystalize by the annealing treatment and remains in the amorphous state.

As described above, the porosity of the debond layer 532 is higher than the porosity of the crystalline layer 531. The crystalline layer 531 includes wide spaces 536 between crystal grain boundaries.

Figure 9B:
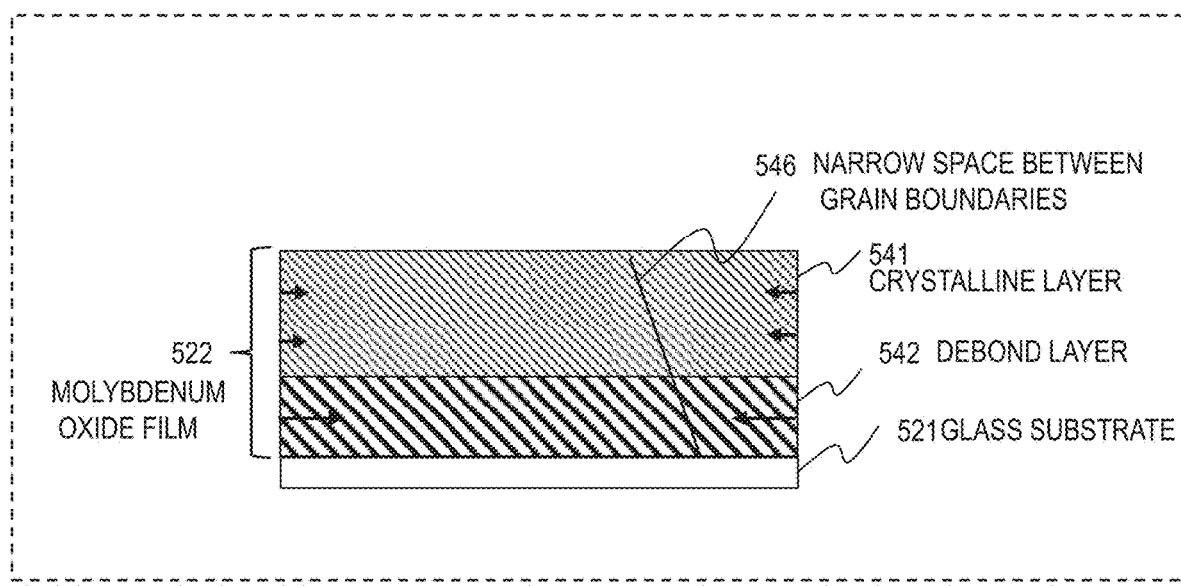
FIG. 9B schematically illustrates the cross-sectional structure of the molybdenum oxide film of the comparative example.

FIG. 9B schematically illustrates the cross-sectional structure of the molybdenum oxide film 522 of the comparative example. The arrows represent the dissolution rates in the directions parallel to the plane of the glass substrate 521 (in in-plane directions). The molybdenum oxide film 522 of the comparative example also has a two-layer structure. The molybdenum oxide film 522 has a crystalline layer 541 as an upper layer (on the side of the barrier film) and a debond layer 542 as a lower layer (on the side of the glass substrate). The proportion of the debond layer 542 in the molybdenum oxide film 522 is higher than that of the debond layer 532 in the molybdenum oxide film 512 of the embodiment.

Unlike the molybdenum oxide film 512 of the embodiment, the space 546 between crystal grain boundaries is narrower than the spaces 536 in the molybdenum oxide film 512 of the embodiment.

The molybdenum oxide film 512 of this embodiment has a debond layer 532 having a large number of pores. This debond layer 532 covers the entire surface of the glass substrate 511. Pure water as solvent enters the pores in the debond layer 532 to dissolve the amorphous parts. The dissolving advances in in-plane directions of the debond layer 532 (in directions parallel to the interface with the glass substrate 511).

The pores increase the area to contact the pure water in the debond layer 532, so that the dissolving rate increases. Since the debond layer 532 has higher porosity than the crystalline layer 531, the dissolving rate is higher than the crystalline layer 531 as indicated by the arrows. Meanwhile, amorphous molybdenum oxide shows higher dissolving rate than polycrystalline molybdenum oxide and therefore, the difference in dissolving rate between the debond layer 532 and the crystalline layer 531 increases more.

As to the molybdenum oxide film 512 of this embodiment, the debond layer 532 in the proximity of the interface with the glass substrate 511 dissolves at high dissolving rate to exhibit the characteristic separation described with reference to FIGS. 6 and 7. After the debonding process, a part of the crystalline layer 531 remains on the surface of the barrier film 303.

As to the molybdenum oxide film 522 of the comparative example illustrated in FIG. 9B, the crystalline layer 541 and the debond layer 542 have few pores for the pure water of solvent to enter; the surface area to contact the pure water is small. For this reason, the dissolving rate is lower than the molybdenum oxide film 512 of this embodiment.

In summary, the porous debond layer in the molybdenum oxide film provided between and in contact with the surface of the glass substrate and the surface of the barrier film achieves high dissolving rate of the molybdenum oxide film between the glass substrate and the barrier film (display panel). The dissolving rate of the porous debond layer in directions parallel to the plane of the glass substrate is higher than in any plane outside of the debond layer and parallel to the plane of the glass substrate. Accordingly, the porous debond layer dissolves in the pure water so that the display panel is separated from the glass substrate.

Although the above-described molybdenum oxide film has a porous crystalline layer, the crystalline layer can be non-porous. The porous layer can be crystalline and does not have to include an interface with another object.

The release film having a porous layer may be made of a material different from molybdenum oxide, such as a metal oxide. The solvent for the release film is determined depending on the material of the release film. Forming the release film first forms a metal oxide film on a substrate and subsequently, anneals the film under predetermined conditions, like forming the above-described molybdenum oxide release film. The annealing crystalizes the metal oxide film and forms a porous layer. The dissolving rate of the porous layer in the in-plane directions parallel to the plane of the base member is higher than the dissolving rate in any other plane outside of the porous layer and parallel to the plane of the base member, so that dissolution of the porous layer separates the object from the base member.

Experimental results about the debond phenomena of the molybdenum oxide film 512 of this embodiment (FIG. 9A) and the molybdenum oxide film 522 of the comparative example (FIG. 9B) are described.

In the experiment, a molybdenum oxide film 512 of this embodiment was formed on a 20-mm square glass substrate; the glass substrate was immersed in water at a temperature of 80° C.; and the time until removal of the molybdenum oxide film 512 from the glass substrate (hereinafter, the first time) was measured. The first time was three seconds. Assuming that the debonding is completed when the solvent penetrating from each side reaches the center, this debonding rate was 3.3 (10/3) [mm/sec]. In the case of the molybdenum oxide film 512, the molybdenum oxide film 512 separated from the glass substrate after three seconds and the separated molybdenum oxide film was completely dissolved after several tens of seconds.

Meanwhile, a molybdenum oxide film 522 of the comparative example was formed on another glass substrate; the glass substrate was immersed in water at a temperature of 80° C.; and the time until removal of the molybdenum oxide film 522 from the glass substrate (hereinafter, the second time) was measured. The second time was 190 seconds. Based on the assumption described above, the debonding rate was 0.053 [mm/sec]. In the case of the molybdenum oxide film 522, all the molybdenum oxide film 522 was dissolved after the 190 seconds.

As described above, the molybdenum oxide film 512 of this embodiment separates from the glass substrate in a short time, compared to the comparative example. The reason for this rapid debonding phenomenon is that the water entering from the sides of the interface between the molybdenum oxide film 512 and the glass substrate dissolves the amorphous substance, speedily passes through the pores to reach the undissolved amorphous substance, and dissolves the remaining amorphous substance. This penetration phenomenon of the water and the dissolution phenomenon of the amorphous substance achieve the rapid debonding phenomenon.

The debonding of this embodiment is applicable to manufacturing not only the OLED display device but also other types of display devices including the liquid crystal display device. The debonding of this embodiment is applicable to the process to separate an object from a base member in manufacturing not only the display device but also other types of devices. The debonding of this embodiment is applicable to separate a semiconductor device such as a printed-wiring board, an imaging device, a light emission device, or a memory from a carrier substrate.

The above-described configuration example employs polyimide for the flexible insulating substrate by way of example. However, the flexible insulating substrate can be an ultrathin glass substrate, for example. The ultrathin glass substrate has a thickness of 0.2 mm, for example, and has flexibility.

To form a device such as an OLED device or a liquid crystal device on an ultrathin glass substrate, the above-described molybdenum oxide film (release film), the ultrathin glass substrate, and the device are formed on a glass substrate 301 as a carrier. A barrier film may be formed between the release film and the ultrathin glass substrate. The thickness of the glass substrate 301 is 0.5 mm, for example. At the final phase of the manufacturing of the display panel, the debond layer of the molybdenum oxide film is dissolved with pure water to separate the ultrathin glass substrate with a display device formed thereon from the glass substrate 301.

The existing display panel manufacturing apparatus is capable of handling a substrate having a thickness of approximately 0.5 mm to 0.7 mm but has difficulty in handling an ultrathin glass substrate having a thickness of 0.2 mm. However, according to this embodiment, it is sufficient that the manufacturing apparatus handle a glass substrate having a total thickness of approximately 0.7 mm (0.2 mm for the thickness of the ultrathin glass substrate plus 0.5 mm for the thickness of the carrier glass substrate 301) in manufacturing a display panel. Accordingly, the existing manufacturing apparatus can be used to manufacture a flexible liquid crystal panel or a flexible OLED panel without any change.

Meanwhile, there is a technique to produce a thinner device by forming a display device on the carrier glass substrate and dissolving the carrier glass substrate with hydrofluoric acid to reduce the thickness into 0.5 mm to 0.2 mm. This embodiment however can produce a thinner display panel without this technique.

As set forth above, embodiments of this invention have been described; however, this invention is not limited to the foregoing embodiments. Those skilled in the art can easily modify, add, or convert each element in the foregoing embodiments within the scope of this invention. A part of the configuration of one embodiment may be replaced with a configuration of another embodiment or a configuration of an embodiment may be incorporated into a configuration of another embodiment.

What is claimed is:

1. A release film to be in contact with a surface of a base member and a surface of an object between the surface of the base member and the surface of the object, the release film comprising:
   a crystalline layer; and
   a debond layer in contact with the crystalline layer,
   wherein the debond layer has pores and includes an amorphous substance soluble in a solvent.

2. The release film according to claim 1, wherein the debond layer is formed on the surface of the base member.

3. The release film according to claim 1,
   wherein a material of the release film is a metal oxide, and
   wherein the amorphous substance in the debond layer has the pores.

4. The release film according to claim 3,
   wherein the release film includes the crystalline layer between the debond layer and the surface of the object, and
   wherein a porosity of the debond layer is higher than a porosity of the crystalline layer.

5. The release film according to claim 4,
   wherein the material of the release film is molybdenum oxide, and
   wherein the solvent is water.

6. The release film according to claim 1, wherein a dissolving rate of the debond layer in a plane parallel to the surface of the base member is higher than dissolving rates in any plane outside of the debond layer and parallel to the surface of the base member.

7. The release film according to claim 1, wherein the base member is a glass substrate and the object is a display panel.

8. A display device manufacturing method, comprising:
   forming a release film on a surface of a substrate in such a manner that the release film is in contact with an entire interface with the surface of the substrate, the release film having pores and including an amorphous substance;
   forming a display panel on the release film; and
   separating the display panel from the substrate by dissolving the release film into a solvent.

9. The display device manufacturing method according to claim 8, wherein the forming the release film includes:
   depositing an amorphous metal oxide as a material of the release film onto the surface of the substrate; and
   annealing the metal oxide deposited on the surface of the substrate to crystalize a part of the metal oxide and form a layer having pores and including an amorphous substance.

10. The display device manufacturing method according to claim 9,
    wherein the material of the release film is molybdenum oxide, and
    wherein the solvent is water.

11. The display device manufacturing method according to claim 8, wherein the dissolving the release film includes hitting an end surface of the release film placed in a gas with the solvent ejected from a nozzle.

12. A device comprising:
    a substrate;
    a display panel; and
    a release film formed to be in contact with a surface of the substrate and a surface of the display panel between the surface of the substrate and the surface of the display panel and to be dissolved when the display panel is separated from the substrate,
    wherein the release film has pores and includes an amorphous substance soluble in a solvent.

13. The device according to claim 12,
    wherein the display panel includes an elastic film holding light emitting elements between a first barrier film and a second barrier film that are capable of blocking moisture penetration, and
    wherein the elastic film has a first surface in contact with the first barrier film and a second surface opposite to the first surface and in contact with the second barrier film and the first surface has a larger area than the second surface.

* * * * *